United States Patent
Ferguson, Jr.

(10) Patent No.: US 7,292,832 B2
(45) Date of Patent: Nov. 6, 2007

(54) TIMING AND FREQUENCY CONTROL METHOD AND CIRCUIT FOR DIGITAL WIRELESS TELEPHONE SYSTEM TERMINALS

(75) Inventor: Paul F. Ferguson, Jr., N. Andover, MA (US)

(73) Assignee: Analog Device, Inc., Norwood, MA (US)

( * ) Notice: Subject to any disclaimer, the term of this patent is extended or adjusted under 35 U.S.C. 154(b) by 735 days.

(21) Appl. No.: 10/245,819

(22) Filed: Sep. 17, 2002

(65) Prior Publication Data

US 2003/0078013 A1    Apr. 24, 2003

Related U.S. Application Data

(60) Provisional application No. 60/322,615, filed on Sep. 17, 2001.

(51) Int. Cl.
    *H04B 1/06* (2006.01)
(52) U.S. Cl. .................. 455/260; 455/209; 375/376; 331/25
(58) Field of Classification Search ............. 455/192.1, 455/192.2, 230, 255, 256–265, 205, 208, 455/209; 375/373–376, 362; 331/78, 25, 331/48, 51, 54
See application file for complete search history.

(56) References Cited

U.S. PATENT DOCUMENTS

| | | | |
|---|---|---|---|
| 5,489,903 A | | 2/1996 | Wilson et al. |
| 5,512,897 A | | 4/1996 | Wilson et al. |
| 5,786,778 A | | 7/1998 | Adams et al. |
| 5,793,819 A | * | 8/1998 | Kawabata ................ 375/344 |
| 5,943,613 A | * | 8/1999 | Wendelrup et al. ...... 455/343.1 |
| 6,044,282 A | * | 3/2000 | Hlasny .................... 455/574 |
| 6,078,633 A | * | 6/2000 | Shiotsu et al. ............ 375/374 |
| 6,100,767 A | * | 8/2000 | Sumi ........................ 331/11 |
| 6,473,607 B1 | * | 10/2002 | Shohara et al. ......... 455/343.1 |
| 6,515,553 B1 | * | 2/2003 | Filiol et al. ............... 332/127 |
| 6,564,046 B1 | * | 5/2003 | Chateau ................... 455/343.1 |
| 6,594,330 B1 | * | 7/2003 | Wilson ..................... 375/376 |
| 6,615,060 B1 | * | 9/2003 | Usui ......................... 455/574 |
| 6,618,456 B1 | * | 9/2003 | Lansdowne ............... 375/354 |
| 6,700,945 B2 | * | 3/2004 | Maeda ...................... 375/376 |
| 6,704,379 B1 | * | 3/2004 | Nagashima ............... 375/355 |

(Continued)

*Primary Examiner*—Edward F. Urban
*Assistant Examiner*—Nhan T. Le
(74) *Attorney, Agent, or Firm*—Wolf, Greenfield & Sacks, P.C.

(57) ABSTRACT

A wireless terminal circuit includes a variable high frequency clock oscillator that provides a high frequency clock signal and a fixed low frequency clock oscillator that provides a low frequency clock signal. A phase-locked loop adjusts a ratio of the frequency of the high frequency clock signal to the low frequency clock signal by adjusting the frequency of the high frequency clock signal. The phase locked loop includes a divider for dividing the high frequency clock signal, the divide ratio of which divider is controlled by a sigma-delta modulator. A wireless terminal local oscillator calibration circuit includes a frequency control circuit including both the high frequency clock oscillator and the low frequency clock oscillator. The calibration circuit also includes a loop circuit that receives a base station clock signal and provides a control signal to the frequency control circuit to adjust the ratio of the frequency of the high frequency clock signal to the frequency of the low frequency clock signals until the high frequency clock signal is calibrated to the base station clock signal.

12 Claims, 3 Drawing Sheets

U.S. PATENT DOCUMENTS

| | | | |
|---|---|---|---|
| 6,725,067 B1* | 4/2004 | Marx et al. | 455/574 |
| 2002/0080901 A1* | 6/2002 | Ham | 375/376 |
| 2004/0017263 A1* | 1/2004 | Livezey | 331/158 |
| 2004/0067742 A1* | 4/2004 | Ormson | 455/258 |

* cited by examiner

TIMING AND FREQUENCY CONTROL METHOD AND CIRCUIT FOR DIGITAL WIRELESS TELEPHONE SYSTEM TERMINALS

This application claims the benefit of U.S. provisional application No. 60/322,615, filed Sep. 17, 2001.

FIELD OF THE INVENTION

The present invention relates to digital wireless telephone systems and, more particularly, to a time and frequency control method and circuit enabling a reduction in power consumed by wireless terminals of digital wireless telephone systems.

BACKGROUND

Digital wireless telephone systems are becoming increasingly popular due to ever-improved performance, clarity etc. Most systems operate with multiple users, each having a wireless terminal (i.e., phone handset, laptop, etc.) and a common base station for controlling signal transmission and receipt by each of the wireless terminals.

One common protocol used in such systems is time-division multiple-access (TDMA), in which the time spectrum is divided into multiple slots of time. The time slots are shared by the multiple users (each having a unique wireless terminal) such that each user is assigned certain time slots within which to transmit and receive signals (i.e., make or receive phone calls from a handset). If there are N users, for example, then each user may be assigned every Nth time slot within which to transmit or receive data.

At fixed intervals, the base station transmits a "paging block", which may include information pertinent to more than one terminal, such as whether a terminal is in receipt of a phone call, for example. Each paging block may have a duration of 20 milliseconds and the fixed intervals between paging blocks may range from ½ to 2 seconds, for example. All users (terminals) attempt to read (receive and decode) each paging block to determine whether in receipt of a phone call. Thus, each terminal may have certain circuit components that power up just before each paging block, in order to read that paging block, and then power down (to save power) between paging blocks (during the ½ to 2 second delay between paging blocks).

With TDMA, it is very important that each wireless terminal maintain an accurate time reference in order to turn "on" at appropriate times, i.e., before each paging block, in order to read that paging block. Wireless terminals typically have a local oscillator for producing a clock signal that is up-converted to a frequency at which to transmit and receive data. It is very important for each wireless terminal to calibrate its local oscillator such that the frequency of the output clock signal matches that of a base station reference clock signal, in order that information is transmitted and received accurately, at a precise time and at a precise radio frequency. The accurate time and frequency references must be maintained by the terminal for a time period (i.e., 20 minutes) that is much greater than the delay (i.e., ½ to 2 seconds) between consecutive paging blocks, in case, for example, a terminal is unable to read a number of consecutive paging blocks due to interference, lack of range, etc.

Calibration of the local clock signal within a wireless terminal to the base station clock signal typically occurs upon power up of the terminal and intermittently thereafter. This serves to provide an accurate frequency at which to receive and transmit signals and serves as a reference to maintain accurate time reference. It is desirable in such systems to reduce the power consumed by the circuitry in the wireless terminal both for cost reasons and so that the terminal can remain operational for as long a period of time as possible without requiring power recharging.

One prior art approach aimed at reducing the amount of power consumed by wireless terminals is shown in FIG. 1. FIG. 1 is a part block, part schematic diagram of a prior art frequency control circuit employed in wireless terminals. As will be described, the prior art frequency control circuit of FIG. 1 employs a precision, low-power digital-to-analog converter (DAC) 22, the digital input to which is updated during frequency calibration sequences. The digital input then is held between calibration sequences to maintain an accurate time reference and clock frequency, enabling other circuit elements to be powered down between paging blocks.

As shown in FIG. 1, the frequency control circuit includes a frequency control input 20, frequency control DAC 22, integrated circuit (IC) pads 24 and 28, a resistor/capacitor filter network (consisting of resistor R and capacitor C1), and a low-jitter voltage-controlled temperature-compensated crystal oscillator (VCTCXO).

During operation, frequency control input 20 receives a digital control signal along bus 9. The digital control signal may be supplied by a digital signal processor (DSP) (not shown). Frequency control input 20, in turn, provides a digital control signal along bus 21 to frequency control DAC 22. Frequency control DAC 22 conventionally converts the digital control signal to an analog signal, which analog signal is filtered by the RC filter (R, $C_1$) before provision to low-jitter VCTCXO 26. Low-jitter VCTCXO 26, in turn, provides an adjusted frequency output signal, based on receipt of the filtered, analog control signal. The signal output will have a frequency adjusted from its center frequency of oscillation (i.e., 13 MHz).

The output signal is fed back along line 27, through pad 28, and along line 29 to clock frequency control DAC 22. While this circuit appears to have a feedback path from the output clock along lines 27 and 29, it should be appreciated that this frequency control circuit actually operates like an open-loop circuit, as the feedback clock signal merely serves to clock frequency control DAC 22, and does not act as an input to the circuit.

One element that consumes a significant amount of power is the VCTCXO. The power consumption is significant due to the requirement of maintaining the VCTCXO powered at all times when the terminal is powered on, particularly for TDMA systems, so that the terminal maintains an accurate time. A VCTCXO is required because the oscillator must be time and temperature stable to maintain an accurate time between calibration sequences. It also must have low-jitter to minimize the amount of phase noise introduced into the signal transmitted from the handset. The use of the high power consuming VCTCXO is a significant drawback of the circuit of FIG. 1.

Another prior art approach at reducing the power consumption of a wireless terminal is described in U.S. Pat. No. 5,416,425 to Nokia. The circuit described in the Nokia patent includes a high frequency local clock oscillator and a low frequency local clock oscillator. During a first step, the high frequency oscillator is calibrated to a received base station clock using an automatic frequency control (AFC) function. During a second step, an error between the high and low frequency clocks is measured. Based on the error, a selector selects one of the high and low frequency clocks for provision to a counter for time measurement. The amount of time the high frequency clock is provided to the counter depends on the error determined. Power is saved when the low frequency clock is provided to the counter for timing, by powering down the high frequency oscillator.

The Nokia approach suffers the drawbacks of: (1) requiring significant calibration time (it's a two-step approach); (2) complexity in implementation; and (3) limited accuracy.

SUMMARY OF THE INVENTION

One embodiment of the present invention is directed to a wireless terminal circuit including a variable high frequency clock oscillator, that provides a high frequency clock signal, and a fixed low frequency clock oscillator, that provides a low frequency clock signal. A phase-locked loop (PLL) adjusts a ratio of the frequency of the high frequency clock signal to the frequency of the low frequency clock signal by adjusting the frequency of the high frequency clock signal.

In an embodiment, the PLL includes a divider for dividing the high frequency clock signal.

In an embodiment, the PLL includes a sigma-delta modulator that controls a divide ratio of the divider.

In an embodiment, an output of the divider clocks the sigma-delta modulator.

In an embodiment, the PLL includes a phase frequency detector that compares a phase of an output of the divider with a phase of the low frequency clock signal.

In an embodiment, the high frequency clock signal oscillator includes a low jitter voltage-controlled oscillator.

In an embodiment, the low frequency clock signal oscillator includes a temperature-controlled crystal oscillator.

In an embodiment, the circuit further includes a timing circuit that maintains a time count based on at least one of the high frequency clock signal and the low frequency clock signal despite periodic power down of the high frequency clock oscillator.

Another embodiment of the present invention, is directed to a method of maintaining accurate time in a wireless terminal comprising the following steps: providing a variable high frequency clock signal; providing a fixed low frequency clock signal; and using a PLL to adjust a ratio of the frequency of the high frequency clock signal to the frequency of the low frequency clock signal by adjusting the frequency of the high frequency clock signal.

A further embodiment of the present invention, is directed to a wireless terminal local oscillator calibration circuit. It includes a frequency control circuit, including a high frequency clock oscillator, that provides a high frequency clock signal, and a low frequency clock oscillator, that provides a low frequency clock signal. It also includes a loop circuit that receives a base station clock signal and provides a control signal to the frequency control circuit to adjust a ratio of the frequency of the high frequency clock signal to the frequency of the low frequency clock signal until the high frequency clock signal is calibrated to the base station clock signal.

BRIEF DESCRIPTION OF THE DRAWINGS

For a better understanding of the present invention, reference is made to the accompanying drawings, which are incorporated herein by reference and in which.

DETAILED DESCRIPTION

Figure 2:
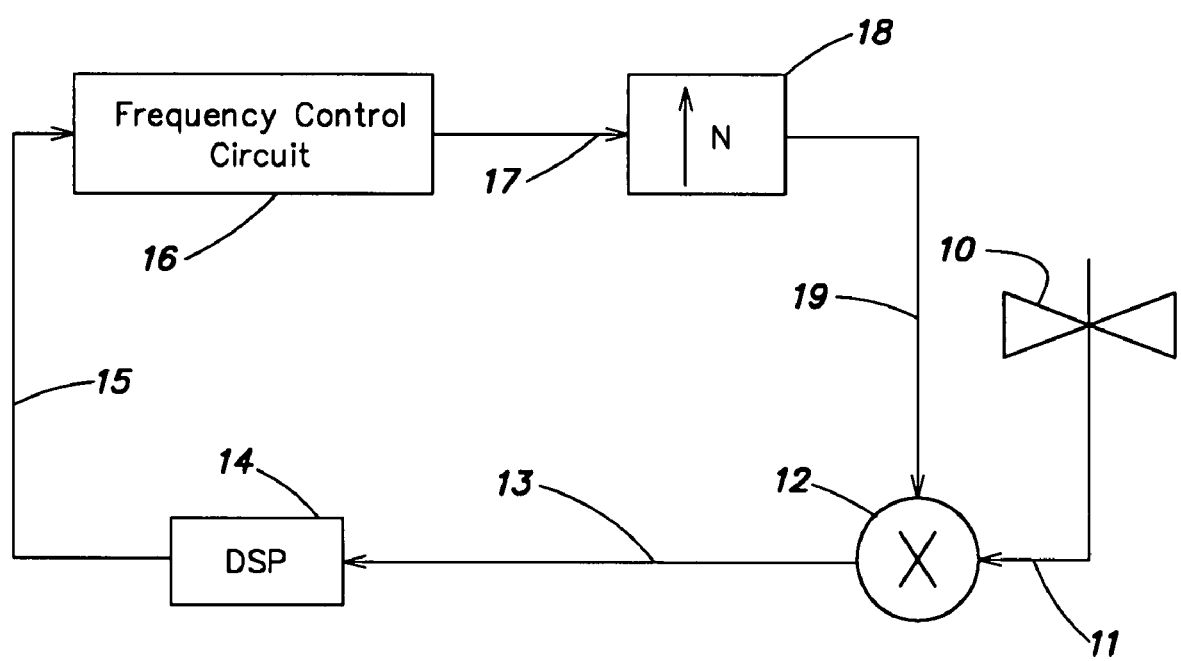
FIG. 2 is a block diagram of a digital wireless terminal local oscillator calibration circuit according to an embodiment of the invention.
Figure 3:
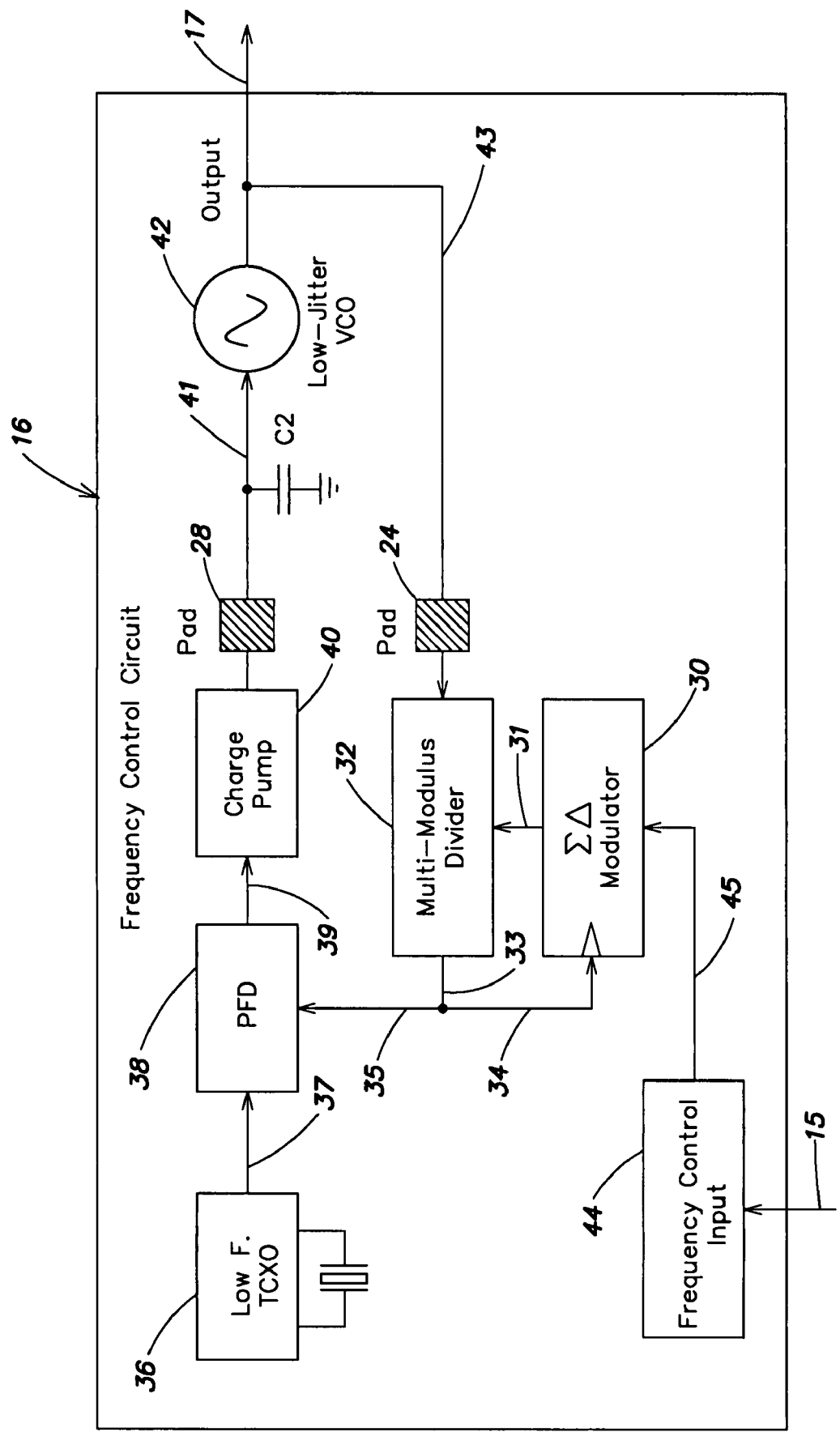
FIG. 3 is a part block, part schematic diagram of a frequency control circuit according to an embodiment of the invention which may be employed in the circuit of FIG. 2.

Two embodiments of the present invention are disclosed. The first embodiment, described with reference to FIG. 2, is a loop circuit that calibrates a high frequency local clock oscillator based on a received base station clock by providing a control signal to a frequency control circuit. The second embodiment, described with reference to FIG. 3, is an exemplary frequency control circuit, employable in the loop of FIG. 2, which includes the high frequency clock oscillator and a low frequency clock oscillator, and which adjusts the ratio of frequencies of the clocks, based on the control signal, by adjusting the frequency of the high frequency clock, until calibrated with the base station clock. By reconstructing the ratio between the clocks, the higher power consuming high frequency clock oscillator can be powered down between paging blocks while maintaining accurate time and frequency references. According to the present invention, this is accomplished quickly, accurately and with relatively simple circuitry.

FIG. 2 is a block diagram of a circuit according to one embodiment of the invention, for use in terminals of digital wireless telephone systems, to calibrate a local oscillator (not shown) such that the circuit output clock frequency matches that of a base station clock signal. This may occur upon power up and at intermittent calibration cycles. As will be described below, the local oscillator typically will operate at a frequency (i.e., 13 MHz) well below that of the base station clock (i.e., 900 MHz), and thus is calibrated to be a factor of the base station clock frequency and up-converted when required for receipt and transmission.

During calibration, a clock signal is sent from the base station at a reference frequency (i.e., 900 MHz) to which reference frequency the wireless terminal local clock oscillator is calibrated. Antenna 10 receives the base station clock signal and provides the received clock signal along line 11 to multiplier/demodulator 12. Multiplier/demodulator 12 also receives the output clock signal (of the wireless terminal) along line 19 and provides an error signal, representing the frequency difference between the two clock signals, if any, on line 13 to digital signal processor (DSP) 14.

DSP 14, from the error signal, provides a control signal along bus 15 to frequency control circuit 16 such that a local oscillator (not shown) within frequency control circuit 16 is adjusted to compensate for the error. Frequency control circuit 16 outputs an adjusted clock frequency signal along line 17 to up-converter element 18, which multiplies the frequency of the clock signal on line 17 by N, and provides the output clock signal on line 19. Thus, as can be seen, the frequency of the local clock oscillator in this exemplary circuit actually is calibrated to the base station clock frequency divided by N. The invention is not so limited, however.

With the feedback loop shown in FIG. 2, the clock frequency of the local oscillator within the frequency control circuit 16 is adjusted such that the output frequency, on line 19, at which the wireless terminal transmits and receives data, is calibrated to be the same (within a margin of error) as the frequency of the clock signal transmitted by the base station and received by antenna 10. When the phrase, "calibrating the high frequency clock signal" is used herein, it is meant to include synchronizing an up-converted high frequency clock signal with a received base station clock signal.

A frequency control circuit according to one embodiment of the invention, that may be employed as the frequency control circuit 16 in the calibration circuitry shown in FIG. 2, is shown in the part block, part schematic diagram of FIG. 3. As will be described, with frequency control circuit 16A of FIG. 3, the high power consuming crystal oscillator may be powered down between paging blocks while accurate time and frequency measurements are maintained.

The frequency control circuit 16A includes a low-frequency, temperature compensated crystal oscillator (TCXO) 36, a phase frequency detector (PFD) 38, a charge pump filter 40, a capacitive filter including capacitor C2, a low-jitter voltage controlled oscillator (VCO), a multi-modulus divider 32, a sigma-delta modulator 30, and a frequency control input 44.

During a calibration operation, a digital control signal is received on bus 15 by frequency control input 44. Frequency control input 44, in turn, provides a digital control signal on bus 45 to sigma-delta modulator 30. Sigma-delta modulator 30, in turn, provides a noise-shaped modulated output of the input control signal on line 31 to multi-modulus divider 32. The output of sigma-delta modulator can be considered a divide ratio to control the ratio by which the multi-modulus divider 32 will divide the output clock signal received along line 43, through pad 24. Multi-modulus divider 32 divides the received output clock signal by the ratio set by the output of the sigma-delta modulator 30. Divider 33 provides the divided clock output on line 33 as an input to PFD 38 along line 35 and to clock sigma-delta modulator 30 along line 34.

Two documents which describe variable sample rate circuits that employ a sigma-delta modulator which controls a divide ratio of a divider include U.S. Pat. No. 5,512,897 to Wilson and U.S. patent application Ser. No. 08/539,438 to Adams, both of which are incorporated herein by reference in their entireties. Benefits of controlling variable rates using a noise-shaped sigma-delta output also are described.

Low frequency TCXO 36, which may be operating at approximately 32 kHz, for example, provides the low frequency temperature-controlled clock signal along line 37 as a second input to PFD 38. PFD 38 compares the phases of the clock output signal of the low frequency TCXO and the divided output clock signal received on line 35 and provides a phase error signal (representing a phase difference between the two) on line 39 to charge pump filter 40. Charge pump filter 40 filters the phase error signal. The filtered phase error signal then is provided through pad 28, through the capacitive filter (including capacitor C2) and along line 41 to adjust the frequency of low-jitter VCO 42. In one embodiment, low-jitter VCO may output a 13 MHz clock signal to an accuracy of 0.1 parts per million. The adjusted clock signal is output on line 17 and fed back on line 43.

The frequency control circuit 16A of the invention is a closed-loop feedback circuit in which a low-jitter VCO 42 is phase-locked to a low frequency TCXO through a fractional-integer frequency synthesizer. The multi-modulus divider is employed in the feedback loop to set the ratio of the output frequency of the low-jitter VCO to be a multiple of the output frequency of the low frequency TCXO. The ratio is controlled by a sigma-delta modulator, enabling non-integer ratios. By altering the input to the sigma-delta modulator, the output frequency, provided on line 17, can theoretically be set to any rational multiple of the clock frequency provided by the low frequency TCXO. The resolution is controlled accurately by the size of the input word to the sigma-delta modulator.

Phase jitter introduced by the multi-modulus divider is noise-shaped by the sigma-delta modulator and then filtered. The filtering occurs by the charge pump filter 40 and the capacitive filter C2, as well as by the inherent frequency-to-phase translation in the loop. The noise is suppressed to be less than the inherent phase noise of the low-jitter VCO 42. The phase noise introduced by the low-frequency TCXO also is suppressed with the same filtering.

Figure 1:
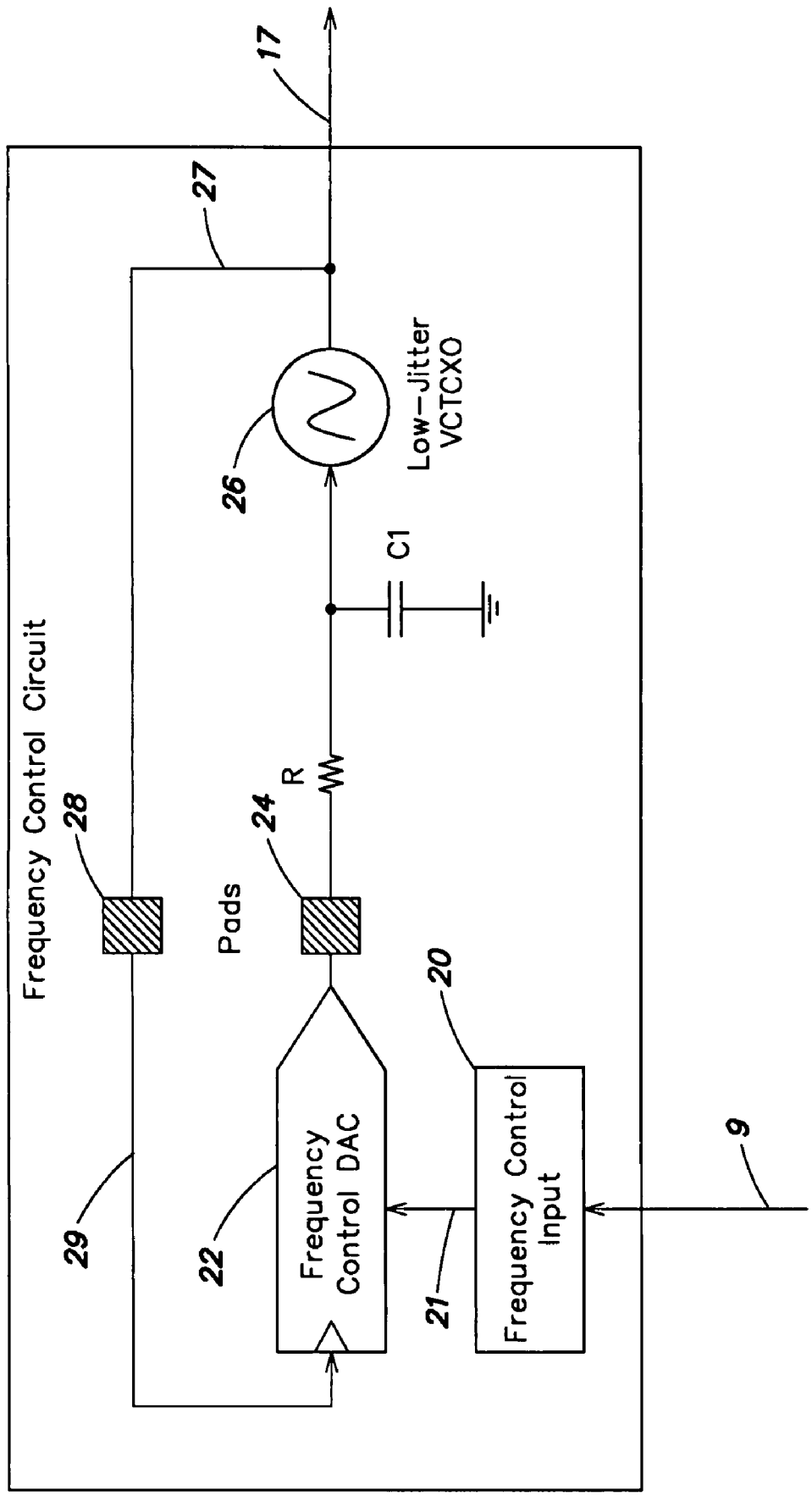
FIG. 1 is a part block, part schematic diagram of a prior art frequency control circuit.

When the frequency control circuit 16A of FIG. 3 is employed as a replacement to the prior art frequency control circuit of FIG. 1, the difference perceived by a user (i.e., software programmer of the DSP) is minimal. The software programmer of the DSP will, for example, program the oscillation frequency by entering a number used to generate the frequency control input, and the speed of the frequency change at the output will depend on the charge pump and capacitive filtering, regardless of the frequency control circuit employed.

In the prior art frequency control circuit shown in FIG. 1, the number entered into the frequency control input 20 is proportional to the output frequency. In the frequency control circuit 16A according to the invention, shown in FIG. 3, the number input to the frequency control input 44 represents the ratio of the frequencies of the low-frequency TCXO and high-frequency VCO. Thus, if it is desired that replacing the prior art frequency control circuit of FIG. 1 with the frequency control circuit of FIG. 3 according to the invention be fully transparent to a user, additional translation logic is envisioned to translate the prior art input number, which represents the desired output frequency, to a number which represents the ratio of oscillator frequencies. The frequency control circuit of FIG. 3 also is fully compatible to replace prior art frequency control circuit of FIG. 1 due to the location of pads 24 and 28 and like elements attached to pads 24 and 28.

Employing the frequency control circuit 16A of the present invention results in tremendous power consumption savings. This occurs for a number of reasons. First, the low frequency TCXO has a significantly low power consumption, particularly when compared to a low-jitter VCTCXO. For example, while a low frequency 32 kHz TCXO consumes approximately 10 microamps, a 13 MHz low-jitter VCTCXO consumes approximately 2 milliamps. Leaving the low frequency TCXO 36 powered on will not contribute significantly to the average circuit power consumption.

The tremendous power savings achieved by the frequency control circuit 16A of the present invention occurs because the low-jitter VCO 42 and related circuitry may be turned off completely when not in use, leaving only the low frequency TCXO powered on. Thus, between calibration cycles and paging blocks, the only circuit element left "on" is the low frequency TCXO, which has relatively very low power consumption.

During the power down time period, the frequency control circuit 16A retains information enabling it to maintain accurate time and to reconstruct the fully-calibrated frequency (achieved, for example, when employed in the circuit of FIG. 2). This is so because the ratio between the calibrated clock frequency output by the low-jitter VCO 42 and the stable clock frequency output by the low frequency TCXO can be derived from the number stored in the frequency control input 44. This derivation can be performed by a DSP (not shown). With the known ratio, the output frequency of the low frequency TCXO can be determined accurately.

If a predetermined number of calibrated low-jitter VCO (i.e., 13 MHz) clock periods is to be counted before power up, that number can be converted into a predetermined number of low frequency TCXO periods, and the integer portion of those periods can be counted with the low-jitter VCO powered down. As the last integer period of the low frequency TCXO periods is approached, the low-jitter VCO 42 can be turned back on and the loop will phase lock the clock signal output of the low-jitter VCO 42 with that of the low frequency TCXO 36. Then, the fractional portion of the low frequency TCXO clock period can be counted by counting the corresponding (derived) fractional clock period of the higher frequency low-jitter VCO clock, resulting in the exact predetermined number of higher frequency low-jitter VCO clock periods being counted without requiring continuous operation of the low-jitter VCO.

One embodiment of circuitry for performing the time measurement and counting includes using a first counter which runs continuously to count the low frequency clock periods and a second counter which counts high frequency clock periods, only upon power up of the high frequency clock oscillator. The continuously running counter, which counts the periods of the low frequency clock, maintains a very accurate time reference. With this accurate time reference, and knowing the precise relationship between the low and high frequency clock periods, it can be determined with accuracy when to power down and when to power up the high frequency clock oscillator. This determination is done without requiring a phase comparison of the high and low frequency clock signals, because the precise relationship is known.

According to the present invention, it is advantageous that the low-frequency TCXO be as temperature and time stable as the VCTCXO was in the circuit shown in FIG. 1. Its initial accuracy is not important so long as there is enough lock range in the PLL to adjust for its inaccuracy. The jitter introduced by the low frequency TCXO is filtered by the PLL. Thus, it does not have to be particularly low jitter. The low-jitter VCO need not be temperature compensated because frequency variations due to temperature will be corrected by the PLL so long as the loop bandwidth is adequate to compensate for them. The sigma-delta modulator will run at the divided (slower) clock rate as a new output will be requested from the sigma-delta modulator only when the multi-modulus divider has completed a divide function. A small portion the multi-modulus divider will run at the higher clock rate (output from the low-jitter VCO), but only when the low-jitter VCO clock is active, and the loop filter will only receive new inputs at the slower (divided) clock rate and also only when the higher frequency low-jitter VCO clock is active.

An advantageous feature of the present invention includes that upon power up, the system need not wait until the high frequency clock oscillator stabilizes. Rather, because the high frequency clock oscillator is in the loop, the recovery upon power up is faster.

An important characteristic relates to the turn-on time of the low-jitter VCO. If the system takes a sufficiently long time to settle back to its powered-up state from a power-down condition, then it will have to be turned on long before it is needed, thus wasting precious power.

An important aspect of the present invention is to maintain the state of the loop constant during the power-down condition of the circuit. Thus, the loop will quickly reacquire a lock when the low-jitter VCO 42 is turned on. The digital logic of the multi-modulus divider and the sigma-delta modulator will maintain its state even when off. For example, the digital sigma-delta modulator will maintain its state when its clock is turned off. The analog voltage on the capacitive filter, however, will not maintain its state during power down. Thus, that analog voltage will have to be held during power-down. This can be accomplished, for example, by converting the analog voltage to a digital word using an analog-to-digital converter (ADC), holding the digital word representing the analog voltage in the digital domain, and then reinstating that voltage through digital-to-analog conversion upon power up.

Frequency control circuit 16A of the present invention also allows for multiple frequencies to be programmed using the same loop circuitry with very little hardware changes, except perhaps for setting a different VCO center frequency. This enables a multi-standard wireless terminal to be implemented.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto

What is claimed is:

1. A wireless terminal circuit comprising:
   a variable high frequency clock oscillator that provides a high frequency clock signal;
   a fixed low frequency clock oscillator that provides a low frequency clock signal;
   a phase-locked loop that adjusts a ratio of the frequency of the high frequency clock signal to the frequency of the low frequency clock signal by adjusting the frequency of the high frequency clock signal; and
   a timing circuit that maintains a time count based on the high frequency clock signal and the low frequency clock signal despite periodic power down of the high frequency clock oscillator, wherein the timing circuit includes a first counter that operates continuously to count the low frequency clock periods.

2. The wireless terminal circuit as claimed in claim 1 wherein the phase-locked loop includes a divider for dividing the high frequency clock signal.

3. The wireless terminal circuit as claimed in claim 2 wherein the phase-locked loop includes a sigma-delta modulator that controls a divide ratio of the divider.

4. The wireless terminal circuit as claimed in claim 3 wherein an output of the divider clocks the sigma-delta modulator.

5. The wireless terminal circuit as claimed in claim 2 wherein the phase-locked loop includes a phase frequency detector that compares a phase of an output of the divider with a phase of the low frequency clock signal.

6. The wireless terminal circuit as claimed in claim 1 wherein the high frequency clock signal oscillator includes a low-jitter voltage-controlled oscillator.

7. The wireless terminal circuit as claimed in claim 1 wherein the low frequency clock signal oscillator includes a temperature-controlled crystal oscillator.

8. A method of maintaining accurate time in a wireless terminal comprising the steps of:

providing a variable high frequency clock signal;
providing a fixed low frequency clock signal;
using a phase-locked loop to adjust a ratio of the frequency of the high frequency clock signal to the frequency of the low frequency clock signal by adjusting the frequency of the high frequency clock signal;
powering down a high frequency clock oscillator that provides the high frequency clock signal for a time period and maintaining a time reference by continuously counting periods of the low frequency clock signal; and
powering up the high frequency clock oscillator and further maintaining the time reference by counting periods of the high frequency clock signal.

9. The method as claimed in claim 8 wherein the step of using a phase-locked loop includes the step of controlling a divider with an output of a sigma-delta modulator to divide the high frequency clock signal.

10. The method as claimed in claim 9 further including the step of comparing a phase of an output of the divider with a phase of the low frequency clock signal.

11. The wireless terminal circuit of claim 1, wherein the timing circuit further comprises a second counter.

12. The wireless terminal circuit of claim 11, wherein the time count is maintained by the first counter counting periods of the low frequency clock signal during the power down of the high frequency clock oscillator, and the second counter further counting periods of the high frequency clock signal.

* * * * *

UNITED STATES PATENT AND TRADEMARK OFFICE
CERTIFICATE OF CORRECTION

PATENT NO. : 7,292,832 B2  
APPLICATION NO. : 10/245819  
DATED : November 6, 2007  
INVENTOR(S) : Paul F. Ferguson, Jr.

Page 1 of 1

It is certified that error appears in the above-identified patent and that said Letters Patent is hereby corrected as shown below:

Title page item 73  
\*\* Assignee: Analog Device, Inc. — should be — Analog Devices, Inc. \*\*

Signed and Sealed this

Fifteenth Day of January, 2008

JON W. DUDAS  
*Director of the United States Patent and Trademark Office*